US012480225B2

(12) United States Patent
Balanetskyy et al.

(10) Patent No.: US 12,480,225 B2
(45) Date of Patent: Nov. 25, 2025

(54) METHOD FOR PRODUCING SILICON SEMICONDUCTOR WAFERS HAVING LOW CONCENTRATIONS OF PINHOLES

(71) Applicant: SILTRONIC AG, Munich (DE)

(72) Inventors: Sergiy Balanetskyy, Freiberg (DE); Matthias Daniel, Freiberg (DE)

(73) Assignee: Siltronic AG, Munich (DE)

( * ) Notice: Subject to any disclaimer, the term of this patent is extended or adjusted under 35 U.S.C. 154(b) by 886 days.

(21) Appl. No.: 17/619,064

(22) PCT Filed: Jun. 2, 2020

(86) PCT No.: PCT/EP2020/065179

§ 371 (c)(1),
(2) Date: Dec. 14, 2021

(87) PCT Pub. No.: WO2020/249422

PCT Pub. Date: Dec. 17, 2020

(65) Prior Publication Data

US 2022/0356601 A1 Nov. 10, 2022

(30) Foreign Application Priority Data

Jun. 14, 2019 (DE) ......................... 102019208670.5

(51) Int. Cl.
*C30B 15/20* (2006.01)
*C30B 29/06* (2006.01)

(52) U.S. Cl.
CPC .............. *C30B 29/06* (2013.01); *C30B 15/20* (2013.01)

(58) Field of Classification Search
CPC ......... C30B 15/00; C30B 15/14; C30B 15/20; C30B 29/00; C30B 29/02; C30B 29/06
USPC ............ 117/11, 13–15, 19–21, 35, 906, 928, 117/931–932
See application file for complete search history.

(56) References Cited

U.S. PATENT DOCUMENTS

| | | | | |
|---|---|---|---|---|
| 4,330,362 A * | 5/1982 | Zulehner | C30B 15/14 | 117/214 |
| 5,037,503 A * | 8/1991 | Kajimoto | C30B 15/02 | 423/349 |
| 5,814,148 A | 9/1998 | Kim et al. | | |
| 5,954,873 A | 9/1999 | Hourai et al. | | |

(Continued)

FOREIGN PATENT DOCUMENTS

| | | |
|---|---|---|
| CN | 1157342 A | 8/1997 |
| CN | 102146583 A | 8/2011 |

(Continued)

*Primary Examiner* — Kenneth A Bratland, Jr.
(74) *Attorney, Agent, or Firm* — BROOKS KUSHMAN P.C.

(57) ABSTRACT

Silicon single crystals having an oxygen concentration of greater than $2\times10^{17}$ at/cm$^3$, a concentration of pinholes having a diameter of greater than 100 μm of less than $1.0\times10^{-5}$ 1/cm$^3$, a carbon concentration of less than $5.5\times10^{14}$ at/cm$^3$, an iron concentration of less than $5.0\times10^{9}$ at/cm$^3$, a COP concentration of fewer than 1000 defects/cm$^3$, a LPIT concentration of fewer than 1 defect/cm$^2$ and a crystal diameter of greater than 200 mm, are produced by the Czochralski method employing a purge gas at specified pressures and flow rates.

12 Claims, 2 Drawing Sheets

(56) References Cited

U.S. PATENT DOCUMENTS

| | | | | |
|---|---|---|---|---|
| 6,110,272 | A * | 8/2000 | Aikawa | C30B 15/02 117/30 |
| 9,665,931 | B2 | 5/2017 | Valley | |
| 2002/0144642 | A1* | 10/2002 | Sreedharamurthy | C30B 15/206 117/19 |
| 2004/0192015 | A1 | 9/2004 | Ammon et al. | |
| 2005/0103256 | A1* | 5/2005 | Sadamitsu | C30B 15/20 117/19 |
| 2007/0163485 | A1 | 7/2007 | Fabry et al. | |
| 2008/0041159 | A1 | 2/2008 | Koester et al. | |
| 2009/0169460 | A1* | 7/2009 | Song | C30B 15/305 423/349 |
| 2011/0195251 | A1* | 8/2011 | Gmeilbauer | C30B 29/06 428/401 |
| 2011/0214603 | A1 | 9/2011 | Minami | |
| 2011/0304081 | A1 | 12/2011 | Weber et al. | |
| 2012/0058040 | A1 | 3/2012 | Haeckl et al. | |
| 2015/0017086 | A1 | 1/2015 | Nagai et al. | |

FOREIGN PATENT DOCUMENTS

| | | | |
|---|---|---|---|
| DE | 102006032431 | A1 | 12/2007 |
| DE | 102010040293 | A1 | 3/2012 |
| DE | 102014217514 | A1 | 10/2014 |
| EP | 0787836 | A2 | 8/1997 |
| EP | 1553214 | A2 | 7/2005 |
| EP | 1808514 | A1 | 7/2007 |
| EP | 2471980 | A1 | 7/2012 |
| EP | 2990508 | A1 | 3/2016 |
| JP | 2000159596 | A | 6/2000 |
| JP | 5009097 | B2 | 6/2012 |
| KR | 100771479 | B1 | 10/2007 |

* cited by examiner

METHOD FOR PRODUCING SILICON SEMICONDUCTOR WAFERS HAVING LOW CONCENTRATIONS OF PINHOLES

CROSS REFERENCE TO RELATED APPLICATIONS

This application is the U.S. National Phase of PCT Appln. No. PCT/EP2020/065179 filed Jun. 2, 2020, which claims priority to German Application No. 10 2019 208 670.5 filed Jun. 14, 2019, the disclosures of which are incorporated in their entirety by reference herein.

BACKGROUND OF THE INVENTION

1. Field of the Invention

The invention relates to a method for producing silicon wafers, comprising melting polysilicon in a crucible, pulling a single crystal on a seed crystal from a melt heated in a crucible according to the Czochralski method and cutting off the wafers from the pulled single crystal.

2. Description of the Related Art

The crucible used in the Czochralski method of single crystal silicon growth usually consists of a silicon dioxide-containing material such as quartz. It is generally filled with fragments and/or with granular material composed of polycrystalline silicon, which is melted with the aid of a lateral heater arranged around the crucible and a base heater arranged under the crucible. After a phase of thermal stabilization of the melt, a monocrystalline seed crystal is dipped into the melt and raised. At the same time, silicon crystallizes at the end of the seed crystal that is wetted by the melt. The rate of crystallization is substantially influenced by the rate at which the seed crystal is raised (crystal lifting rate) and by the temperature at the interface at which melted silicon crystallizes. By appropriate control of these parameters, what is first pulled is a segment referred to as the neck for eliminating dislocations, then a cone-shaped segment of the single crystal and lastly a cylindrical segment of the single crystal, from which the wafers are later cut off.

As described in U.S. Pat. No. 5,954,873 A for example, the relevant process parameters in the crystal-pulling method are set such that a radially homogeneous distribution of defects in the crystal is achieved.

In particular, care is taken that agglomerates composed of empty sites (vacancies), which are also called COPs (crystal originated particles), do not form or only form below the detection limit. A density of 1000 defects/$cm^3$ is hereinafter understood to be the detection limit for COPs.

At the same time, care is taken that agglomerates composed of interstitial silicon atoms, which are named LPITs, do not occur or only occur below the detection limit. A LPIT density of 1 defect/$cm^2$ is hereinafter understood to be the detection limit.

This semiconductor material is hereinafter referred to as "defect-free".

Gaseous inclusions in the crucible material which become released, gas which surrounds the fragments and/or the granular material, silicon oxide which forms in the melt and gas which diffuses into the melt are considered to be possible causes of the formation of cavities in the single crystal that are called pinhole defects (not to be confused with COPs). Pinhole defects are formed when gas bubbles reach the interface between the growing single crystal and the melt and the single crystal crystallizes around them. If, when cutting off the wafers, the parting planes intersect the cavities, the wafers which are formed have circular indentations or holes with a diameter which can typically be a few micrometres to a few millimetres. Wafers in which such cavities are present are unusable as substrate slices for production of electronic components.

It is possible to measure the concentration of the pinholes which form on rod pieces with, for example, the aid of the scanning ultrasound method, which has been described in, for example, DE 102 006032431 A1 What are detected in this case are pinholes from a diameter of about 50 μm. With this method, determination of the respective accurate size of the pinholes is tarnished with relatively large measurement errors.

U.S. Pat. No. 9,665,931 A1 describes a method for determining the concentration and the respective size of pinholes on wafers. With this method, the size of the pinholes can be established very accurately.

To be able to accurately measure the size of pinholes in rod pieces, the rod piece to be measured is preferably subjected to the measurement according to DE 102 006 032431 A1, with the coordinates of the pinholes found being saved at the same time.

Subsequently, the region containing relevant pinholes is preferably sliced into wafers and analysed by means of the method described in U.S. Pat. No. 9,665,931 A1. The size of the pinholes thus found can be determined therewith with an inaccuracy of measurement of a few %.

The inventors have discovered that semiconductor material that contains a comparatively high concentration of pinholes greater than 50 μm in diameter is characterized as "defective". Therefore, the main concern is to avoid pinholes having a diameter of 50 μm or greater.

A range of proposals have already been published as to how pinhole formation can be suppressed. Many of these proposals focus on improving the properties of the crucible material. The size of the pinholes which form when using suitable crucible material is preferably less than 50 μm.

There are also proposals (for example: EP 247 1980 A1) which optimize the setup of the crucible in order to thus avoid crucible damage and therefore the formation of gas bubbles in the melt and, as a result, pinholes in the single crystal.

Other proposals concentrate on suppressing or eliminating pinholes during the period of melting the fragments and/or the granular material. For example, what is recommended in US 2011/304081 A1 is to gently treat the crucible by means of a suitable time-varied output distribution of the heaters used such that the density of the pinholes which appear in the crystal is reduced.

To achieve the desired (defect) properties of the pulled crystal, it is necessary to set the distribution of the heat output appropriately in a fixed ratio. This is contrary to, for example, the method proposed in DE10 339 792 A1. It is thus impossible to achieve both goals (low concentration of pinholes and desired defect properties).

JP-5009097 A2 describes a method for producing a silicon single crystal, in which the pressure in the crystal-pulling system is reduced to a pressure of from 5 to 60 mbar when the polysilicon is melted and the pressure is 100 mbar or greater when the crystal is pulled.

US 2011/214603 A1 describes a method for producing a silicon single crystal, in which the output of the heaters is set higher during melting than during subsequent crystal-pulling. In addition, the pressure during melting is set to 30 mbar or lower, which is lower than in the subsequent crystal-pulling.

However, it has become apparent that the described methods have disadvantages. In particular, it has been found that the pulled single crystals have increased impurity values with regard to carbon and iron. In addition, expectations were not met by the high density of large pinholes which appeared.

The inventors have discovered that it is not possible with the methods proposed in the prior art to produce single crystals according to the Czochralski method that have both a very low density of large pinholes and a very low iron and carbon contamination with simultaneously the desired defect properties (defect-free).

It is an object of the invention to provide a method which makes it possible to produce a defect-free crystal which has both a minimum concentration of pinholes having a size of greater than 50 μm and a minimum carbon and iron impurity.

It is furthermore an object of this invention to provide silicon crystals which have a minimum concentration of both carbon and iron, are simultaneously defect-free and have a minimum concentration of pinholes having a size of greater than 50 μm.

SUMMARY OF THE INVENTION

These and other objects are achieved by growing a silicon single crystal by the Czochalski method in a pulling system purged by a purge gas at a flow rate f and a pressure p such that p is not greater than 7 umbar, and f (1/h)>400·p(mbar).

DETAILED DESCRIPTION OF THE PREFERRED EMBODIMENTS

The features specified in relation to the above-mentioned embodiments of the method according to the invention can be applied mutatis mutandis to the products according to the invention. Conversely, the features specified in relation to the above-mentioned embodiments of the products according to the invention can be applied mutatis mutandis to the method according to the invention. These and other features of the embodiments according to the invention are elucidated in the description of the figures and in the claims. The individual features can be realized either separately or in combination as embodiments of the invention. Furthermore, they can describe advantageous embodiments which are independently protectable. A person skilled in the art understands the unit (litres per hour) to mean standard litres per hour, i.e. the volume per hour that the gas would have at standard pressure.

Figure 2:
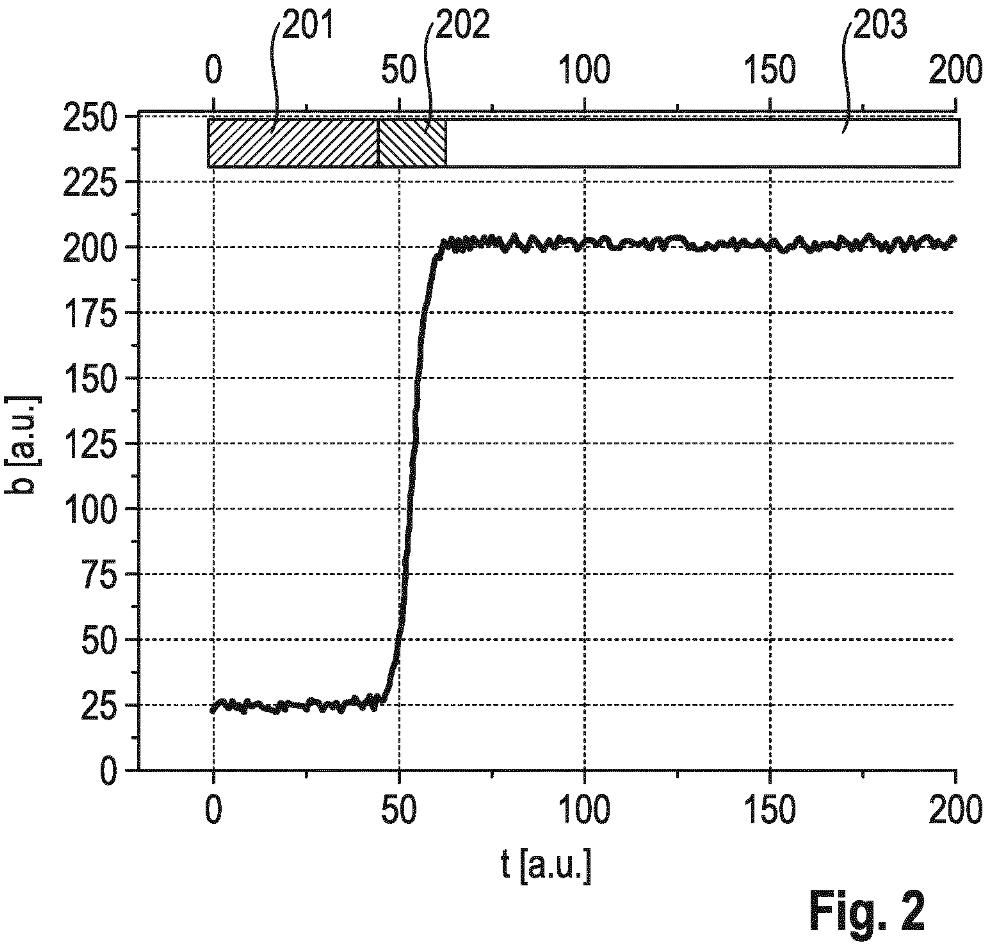
FIG. 2 shows a typical profile of the brightness, measured with a camera, during silicon heating in brightness values b over time in relative units in each case.

As shown in FIG. 2, during heating of the silicon in the crucible, the brightness measured remains initially constant within the limit of error tolerance (201). With the onset of the solid-to-liquid phase transition, the brightness signal rises sharply (202).

Once the silicon has completely melted, the brightness measured is again constant (203), but at a higher level than at the start (201).

Polysilicon melting is to be understood to mean the process in which polysilicon is brought from room temperature in a solid state to a temperature greater than the melting temperature in a liquid state. The end of the melting process is defined as the time point of placing the seedling for crystal-pulling. Crystal-pulling starts afterwards.

Table 1 summarizes the measurement results concerning the concentrations of pinholes, carbon and iron in the pulled crystals, which were pulled both according to the prior art (Comparative Examples 1 and 2) and according to the invention (Examples 3, 4 and 5).

Rods were pulled according to the Czochralski method, having a nominal diameter of either 300 mm or 200 mm. This involved polycrystalline silicon being stacked into a quartz crucible known from the prior art and being provided for crystal-pulling.

Means for producing defect-free crystals were used for crystal-pulling. In principle, this can be achieved with a CUSP magnetic field, a horizontal magnetic field or with a travelling magnetic field. Furthermore, crystal rotation and crucible rotation are set appropriately for this purpose.

The results shown in Table 1 come from crystals which were pulled using a horizontal magnetic field. In addition, crystal rotation and crucible rotation were varied such that a different oxygen concentration was achieved in each case.

For what is further described, the type of magnetic field used is irrelevant; what is essential is that a centrally upwardly directed melt flow is achieved so that a defect-free crystal is pulled.

Each monocrystalline rod thus pulled was, in addition, divided into rod pieces using a band saw and cut into wafers in accordance with the prior art, and these were examined both for pinholes and defect properties and for impurities (carbon, iron).

Carbon concentration in silicon was measured with the aid of gas fusion analysis, which, for example, has been described in DE 1020 14217514 A1.

Iron concentration was measured with the aid of the ICPMS (Inductively Coupled Plasma Mass Spectrometry) method. It can also be measured using NAA (neutron activation analysis) with suitable calibration.

Example 1 in Table 1 shows the results achievable with conventional means known from the prior art. In this case, the concentration of pinholes was identified as excessively high.

With the aim of decreasing the concentration of pinholes in the monocrystalline rod, what was first attempted by the inventors was to reduce the pressure during polysilicon melting to the extent that—as described in JP-5009097 A2—the gases which possibly form cannot cause pinholes. In this connection, the inventors have discovered that this measure is only suitable to a limited extent for appropriately reducing the concentration. The results are summarized in Example 2 in Table 1.

It became apparent that the measure brings about a clearly additional increased contamination of the monocrystalline rods with carbon and iron (Table 1: Example 2).

The inventors have therefore discovered that additional measures should be carried out in order to solve these problems.

When setting up the crucible, care is taken that polysilicon having very low impurity levels is preferably used, as described in DE 10 2010 040 293 A1 for example.

Preferably, silicon having an average mass-based specific surface area of less than 2 $cm^2/g$ is used. Very particularly preferably, the crucible is set up with polysilicon having a mass-specific surface area of less than 1 $cm^2/g$ at a distance of less than 5 cm and greater than 2 cm from the crucible wall. The remainder of the crucible volume is set up with polysilicon having a mass-specific surface area of greater than 1 $cm^2/g$ and less than 5 $cm^2/g$.

The single silicon crystals prepared in accordance with the invention are characterized by a carbon concentration of less than $5.5\times10^{14}$ at/$cm^3$; preferably less than $4\times10^{14}$ at/$cm^3$; an iron concentration of less than $5.0\times10^{9}$ at/$cm^3$; preferably less than $1.0\times10^{9}$ at/$cm^3$; a COP concentration of less than 1000 defects/$cm^2$; and a concentration of agglomerates composed of interstitial silicon atoms of less than 1 defect/$cm^2$. The single crystal diameter is preferably greater than 200 mm, more preferably greater than 300 mm. The concentration of pinholes having a diameter greater than 100 μm is less than $1.0\times10^{-5}$ $cm^{-3}$, and the concentration of pinholes having a diameter of greater than 50 μm is also preferably less than $1.0\times10^{-5}$ $cm^{-3}$ During polysilicon melting, a pressure in the crystal-pulling system of preferably not greater than 10 mbar is set. At the same time, the total flow rate f [l/h] of a purge gas through the pulling system is preferably set such that it is greater than the pressure p [mbar] multiplied by 160.

Figure 1:
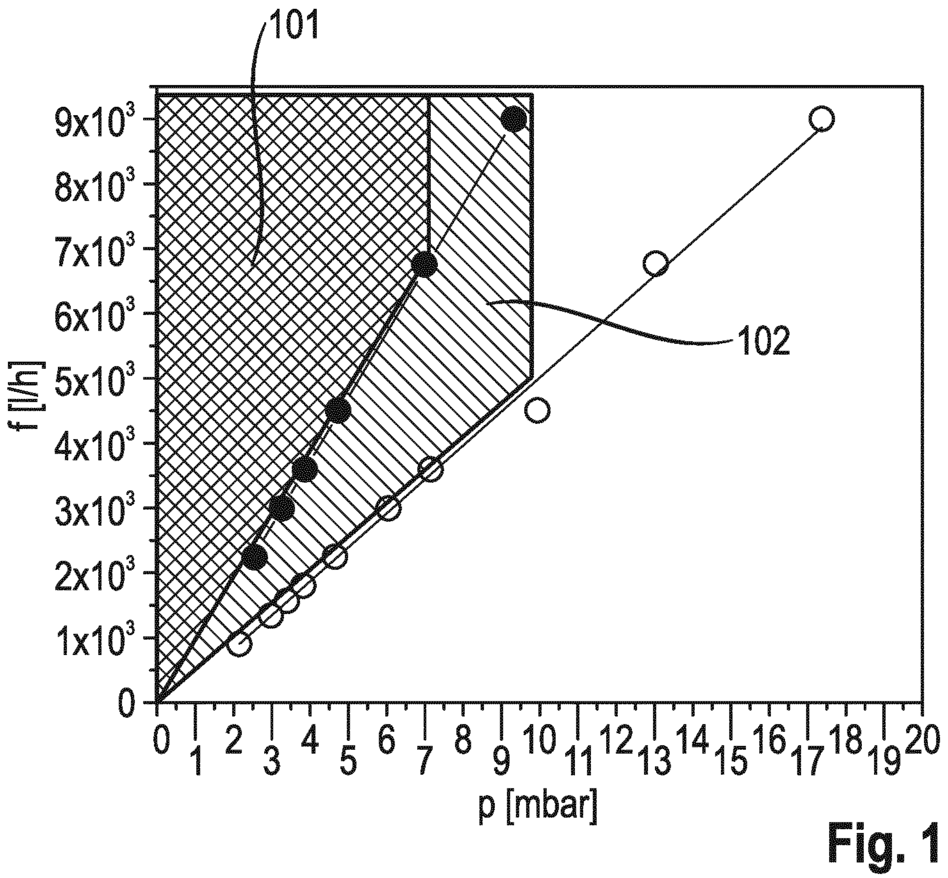
FIG. 1 shows the relationship between the flow rate f [l/h] of the inert gas and the applied pressure p [mbar].

FIG. 1 shows the preferred area of pressure p and flow rate f in (102).

Preferably, the total flow rate f [l/h] of a purge gas through the pulling system is set such that it is greater than the pressure p [mbar] multiplied by 400, more preferably 720. At the same time, the pressure is preferably set not greater than 10 mbar.

FIG. 1 shows the preferred area of pressure p and flow rate f in (101).

In general, it is advantageous to keep the flow rate f as high as possible and, simultaneously, to keep the pressure as low as possible. The maximum flow rate at a given pressure is, then, only dependent on the pump output.

ated image data can be established can be correlated very well with the time point of the start of the solid-to-liquid phase transition.

FIG. 2 shows, for example, brightness as a function of time. It became apparent that the pressure should preferably be increased in the time point between the regions (201) and (202) in order to achieve a further positive effect with respect to the density of pinholes and the concentration of carbon and iron.

Example 4 in Table 1 shows the results of crystals that were achieved with above-described means according to the invention.

In an additional embodiment, polysilicon which had a chlorine content of 1 ppba was used for setup.

The inventors have discovered in this case that, surprisingly, the use of polysilicon having a chlorine content of greater than 1 pbba has further positive effects on iron contamination, even though a person skilled in the art would make the assumption that chlorine at high temperatures ought to release iron from the system and to contaminate the silicon.

Example 5 in Table 1 shows the results of crystals that were achieved with above-described means according to the invention.

The above description of exemplary embodiments is to be understood exemplarily. The disclosure made thereby firstly allows a person skilled in the art to understand the present invention and the associated advantages and secondly also encompasses alterations and modifications to the described structures and methods that are obvious in the understanding of a person skilled in the art. Therefore, all such alterations and modifications and also equivalents are intended to be covered by the scope of protection of the claims.

| | Example 1 Comparative | Example 2 Comparative | Example 3 Inventive | Example 4 Inventive | Example 5 Inventive |
|---|---|---|---|---|---|
| Pinholes [$10^4$/$cm^3$] | 1 | 0.30 | 0.10 | 0.06 | 0.05 |
| Carbon [$10^{14}$ at/$cm^3$] | 6 | 143 | 5.2 | 5.1 | 3.4 |
| Iron [$10^9$ at/$cm^3$] | 7 | 10 | 4 | 3 | 1 |
| COP Concentration [1/$cm^3$] | <1000 | <1000 | <1000 | <1000 | <1000 |
| Lpit Concentration [1/$cm^2$] | none | none | none | none | none |
| Oxygen 0, [$10^{17}$ at/$cm^3$] | 5 | 2 | 2.1 | 5.8 | 4.5 |
| Nominal Diameter [mm] | 300 | 300 | 300 | 300 | 300 |

The purge gas used during melting comprises gases from the list of the gases argon, helium, nitrogen or combinations thereof. Preferably, argon having a degree of purity of greater than 99.99% by volume is used.

Example 3 in Table 1 shows the results of crystals that were achieved with above-described means according to the invention.

In a further embodiment, the pressure (and thus also the flow rate of the purge gas) was increased once the first polysilicon had become liquid. The pressure increase was, in this connection, 4 mbar, preferably 8 mbar and more preferably 12 mbar.

The melting process was, in this connection, observed using a camera which determines, by means of suitable digital image processing methods, the time point from which the first silicon has become liquid.

The inventors have discovered that the time point at which a significant increase in the brightness of the evalu-

The invention claimed is:

1. A method for producing silicon wafers, comprising:

melting polysilicon in a crucible, pulling a single crystal having a diameter greater than 200 mm in a Czochralski pulling system, dividing the single crystal into crystal pieces and cutting the crystal pieces into wafers, further comprising:

purging the pulling system with a purge gas during the melting of the polysilicon, wherein the following relationship applies to the flow rate f of the purge gas and the pressure p in the pulling system during the melting of the polysilicon:

$$\text{flow rate } f[\text{l/h}] > 400\times\text{pressure } p[\text{mbar}],$$

wherein the pressure p in the pulling system is less than 7 mbar.

2. The method of claim 1, wherein the following relationship applies to the flow rate of the purge gas f and the pressure in the pulling system p during at least a portion of the melting of the polysilicon:

$$\text{flow rate } f[\text{l/h}] > 720 \times \text{pressure } p[\text{mbar}].$$

3. The method of claim 1, wherein the crucible is charged with polysilicon having, on average, a mass-based specific surface area of less than 2 $cm^2/g$.

4. The method of claim 1, wherein the polysilicon has a chlorine content of greater than 1 ppba.

5. The method of claim 1, wherein the silicon single crystal has an oxygen concentration of greater than $2\times10^{17}$ $at/cm^3$, a concentration of pinholes having a diameter of greater than 100 μm of less than $1.0\times10^{-5}$ $1/cm^3$, a carbon concentration of less than $5.5\times10^{14}$ $at/cm^3$, an iron concentration of less than $5.0\times10^{9}$ $at/cm^3$, a COP concentration of fewer than 1000 $defects/cm^3$, a concentration of agglomerates composed of interstitial silicon atoms of fewer than 1 $defect/cm^2$ and a crystal diameter of greater than 200 mm.

6. The method of claim 5, wherein the silicon single crystal has a carbon concentration of less than $4\times10^{14}$ $at/cm^3$.

7. The method of claim 5, wherein the silicon single crystal has an iron concentration of less than $1.0\times10^{9}$ $at/cm^3$.

8. The method of claim 5, wherein the silicon single crystal has a carbon concentration of less than $4\times10^{14}$ $at/cm^3$, and an iron concentration of less than $1.0\times10^{9}$ $at/cm^3$.

9. The method of claim 5, wherein the single crystal has a concentration of pin-holes having a diameter of greater than 50 μm of less than $1.0\times10^{-5}$ $1/cm^3$.

10. The method of claim 8, wherein the single crystal has a concentration of pin-holes having a diameter of greater than 50 μm of less than $1.0\times10^{-5}$ $cm^{-3}$.

11. The method of claim 1, wherein the single crystal has a diameter of greater than 300 mm.

12. The method of claim 5, wherein the single crystal has a diameter of greater than 300 mm.

* * * * *